(12) United States Patent
Zhou et al.

(10) Patent No.: US 10,242,791 B2
(45) Date of Patent: Mar. 26, 2019

(54) COUPLED-INDUCTOR MODULE AND VOLTAGE REGULATING MODULE COMPRISING THE SAME

(71) Applicant: Delta Electronics (Shanghai) CO., LTD, Shanghai (CN)

(72) Inventors: Jinping Zhou, Shanghai (CN); Zhangnan Xin, Shanghai (CN); Pengkai Ji, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 15/920,548

(22) Filed: Mar. 14, 2018

(65) Prior Publication Data

US 2018/0204666 A1    Jul. 19, 2018

Related U.S. Application Data

(63) Continuation-in-part of application No. 15/784,864, filed on Oct. 16, 2017.

(30) Foreign Application Priority Data

Oct. 28, 2016 (CN) .......................... 2016 1 0969989
May 5, 2017 (CN) .......................... 2017 1 0312684
May 5, 2017 (CN) .......................... 2017 1 0313185

(51) Int. Cl.
*H01F 27/24* (2006.01)
*H01F 27/28* (2006.01)
(Continued)

(52) U.S. Cl.
CPC .......... *H01F 27/2823* (2013.01); *G05F 3/08* (2013.01); *H01F 27/24* (2013.01); *H01F 27/29* (2013.01); *H01L 27/02* (2013.01); *H02M 3/04* (2013.01)

(58) Field of Classification Search
CPC .......... H01F 27/29; H01F 27/24; H01F 27/28; H01F 17/04; H01F 17/043; H01L 27/02;
(Continued)

(56) References Cited

U.S. PATENT DOCUMENTS

2004/0174241 A1* 9/2004 He ...................... H01F 27/2804
336/200
2009/0167477 A1* 7/2009 Feng ................... H01F 17/0033
336/200
(Continued)

FOREIGN PATENT DOCUMENTS

CN    203659591 U    6/2014
CN    104021920 A    9/2014
(Continued)

OTHER PUBLICATIONS

The CN1OA issued Jan. 28, 2019 by the CNIPA.

*Primary Examiner* — Adolf Berhane
(74) *Attorney, Agent, or Firm* — Yunling Ren

(57) ABSTRACT

A coupled-inductor module includes: a magnetic core including a first magnetic column, a second magnetic column, a third magnetic column extending in a first direction and two covers extending in a second direction, the first magnetic column disposed between the second magnetic column and the third magnetic column, the two covers respectively connected to the ends of the first magnetic column, the second magnetic column and the third magnetic column; and windings including a first winding and a second winding respectively wound around the first magnetic column, the first winding and the second winding being spaced apart from each other in the first direction. The magnetic core is provided with at least one air gap, and the windings and the air gap are not overlapped with each other.

16 Claims, 25 Drawing Sheets

(51) Int. Cl.
*H02M 3/04* (2006.01)
*G05F 3/08* (2006.01)
*H01F 27/29* (2006.01)
*H01L 27/02* (2006.01)

(58) Field of Classification Search
CPC .......... H05K 1/11; H05K 1/115; H05K 1/181; H05K 2201/1008; H01K 1/185
See application file for complete search history.

(56) References Cited

U.S. PATENT DOCUMENTS

| | | | | |
|---|---|---|---|---|
| 2010/0007451 A1* | 1/2010 | Yan | .................... | H01F 17/043 |
| | | | | 336/90 |
| 2015/0194254 A1* | 7/2015 | Dai | .................... | H01F 3/10 |
| | | | | 336/220 |
| 2016/0141088 A1* | 5/2016 | Dai | .................... | H01F 3/14 |
| | | | | 336/178 |
| 2016/0181001 A1* | 6/2016 | Doljack | .................... | H01F 27/24 |
| | | | | 336/221 |
| 2017/0104419 A1* | 4/2017 | Zeng | .................... | H01F 38/14 |
| 2017/0141695 A1* | 5/2017 | Zeng | .................... | H01F 27/40 |
| 2017/0250025 A1* | 8/2017 | Wei | .................... | H01F 41/069 |
| 2017/0287615 A1* | 10/2017 | Lu | .................... | H01F 1/34 |
| 2017/0301961 A1* | 10/2017 | Kim | .................... | H01M 10/425 |
| 2018/0124922 A1* | 5/2018 | Ji | .................... | H01L 23/3121 |

FOREIGN PATENT DOCUMENTS

| | | | | |
|---|---|---|---|---|
| CN | 104966604 A | 10/2015 | | |
| WO | WO 2011088777 A1 * | 7/2011 | ............... | H01F 3/14 |

\* cited by examiner

COUPLED-INDUCTOR MODULE AND VOLTAGE REGULATING MODULE COMPRISING THE SAME

CROSS-REFERENCE TO RELATED APPLICATIONS

This application is a Continuation-in-Part application of, U.S. application Ser. No. 15/784,864, filed on Oct. 16, 2017, which is based upon and claims priority to Chinese Patent Applications No. 201610969989.6 filed on Oct. 28, 2016 and No. 201710312684.2 filed on May 5, 2017, and is based upon and claims priority to Chinese Patent Application 201710313185.5, filed on May 5, 2017, the entire contents of which are incorporated herein by reference.

TECHNICAL FIELD

The present disclosure relates to a coupled-inductor module and a voltage regulating module including the same. More specifically, the present disclosure relates to a coupled-inductor module, which has the advantages of low profile, small flux leakage, simple manufacturing process, etc., and a voltage regulating module including the same.

BACKGROUND

In recent years, with the development of technologies such as data center, artificial intelligence and the like, the CPU, the GPU and the various integrated circuits (ICs) has increasingly higher speed and larger working current, due to which an increasingly stricter requirement is imposed to the power density, efficiency and dynamic performance of the voltage regulating module (VRM) serving for powering them, and makes a greater challenge to the design of the VRM. In the voltage regulation module, the output inductor usually has the greatest volume, and the selection of the inductance would directly affect the efficiency and dynamic performance of the entire VRM. One approach to reduce the volume of the inductor and improve the efficiency and dynamic performance of the inductor is adopting an inverse-coupled-inductor module, which is a hot spot of VRM design currently. However, the conventional inverse-coupled-inductor module usually has a greater height and thus cannot be applied to some conditions with relatively high requirements on VRM height.

It should be noted that, information disclosed in the above background portion is provided only for better understanding of the background of the present disclosure, and thus it may contain information that does not form the prior art known by those ordinary skilled in the art.

SUMMARY

Embodiments of the present disclosure provide a coupled-inductor module and a voltage regulating module including the coupled-inductor module. The technical solution is as follows:

According to an aspect of the present disclosure, there is provided a coupled-inductor module including:

a magnetic core, including a first magnetic column, a second magnetic column, and a third magnetic column extending in a first direction and two covers extending in a second direction, wherein the first magnetic column is disposed between the second magnetic column and the third magnetic column, the two covers are respectively connected to two ends of the first magnetic column, two ends of the second magnetic column and two ends of the third magnetic column; and windings, including a first winding and a second winding respectively wound around the first magnetic column, the first winding and the second winding being spaced apart from each other in the first direction, wherein the magnetic core is provided with at least one air gap, and the windings and the air gap are not overlapped with each other.

According to another aspect of the present disclosure, there is provided a voltage regulating module, including:

a coupled-inductor module, including: a magnetic core, comprising a first magnetic column, a second magnetic column, and a third magnetic column extending in a first direction and two covers extending in a second direction, wherein the first magnetic column is disposed between the second magnetic column and the third magnetic column, the two covers are respectively connected to two ends of the first magnetic column, two ends of the second magnetic column and two ends of the third magnetic column; and windings, including a first winding and a second winding respectively wound around the first magnetic column, the first winding and the second winding being spaced apart from each other in the first direction, wherein the magnetic core is provided with at least one air gap, and the windings and the air gap are not overlapped with each other, and wherein the first winding having a first terminal and a second terminal, the second winding having a third terminal and a fourth terminal, the second terminal of the first winding and the fourth terminal of the second winding are electrically connected to each other;

a first switch unit connected to the first terminal of the first winding; and a second switch unit connected to the third terminal of the second winding.

It is to be understood that both the foregoing general description and the following detailed description are exemplary and explanatory only and are not restrictive of the disclosure.

This section provides a summary of various implementations or examples of the technology described in the disclosure, and is not a comprehensive disclosure of the full scope or all features of the disclosed technology.

BRIEF DESCRIPTION OF THE DRAWINGS

The drawings herein incorporated into and constituting a part of this specification illustrate embodiments consistent with the present disclosure and, together with the description, serve to explain the principles of the disclosure.

From the above drawings, embodiments of the present disclosure are shown and will be described in more detail below. These drawings and descriptions are not intended to limit the scope of the inventive concept in any way, but rather to explain one of ordinary skill in the art the concepts of the present disclosure by referring to specific embodiments.

DETAILED DESCRIPTION

Exemplary embodiments will be described in detail herein, examples of which are illustrated in the accompanying drawings. When the following description refers to the accompanying drawings, the same numerals in different drawings denote the same or similar elements unless otherwise indicated. The implementations described in the following example embodiments do not represent all implementations consistent with the present disclosure. Rather, they are merely examples of devices and methods consistent with some aspects of the disclosure, as set forth in the appended claims.

Figure 1A:
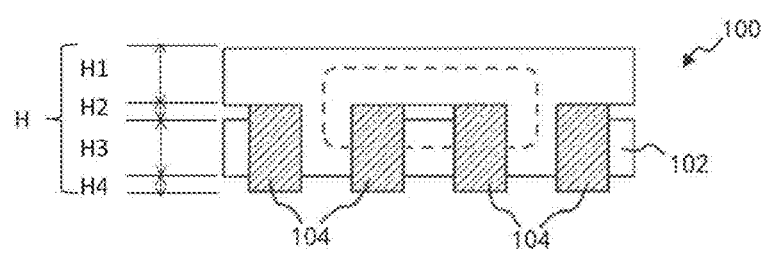
FIG. 1A is a schematic diagram of a two-phase coupled-inductor module according to a comparison embodiment of the present disclosure.
Figure 1B:
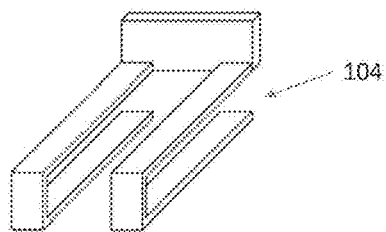
FIG. 1B is a perspective view of the windings in the two-phase coupled-inductor module in FIG. 1A.

FIG. 1A is a schematic diagram of a two-phase coupled-inductor module according to a comparison example of the present disclosure. FIG. 1B is a perspective view of windings in the two-phase coupled-inductor module in FIG. 1A. Referring to FIG. 1A and FIG. 1B, the two-phase coupled-inductor module 100 includes a magnetic core 102 and two windings 104. The two windings 104 are respectively wound on the magnetic core 102. In the two-phase coupled-inductor module 100, the external leads of the two windings 104 (i.e., the lead connecting the winding to external circuit) are disposed below the inductor. The four inductor leads are in the same plane and the plane where the magnetic flux (shown as a dotted line in FIG. 1A) is located is perpendicular to the plane where the inductor leads are located. In this case, the height H of the entire two-phase coupled-inductor module 100 includes the height of two layers of cores (H1, H3) and the height of two layers of windings (H2, H4), so that the overall height of the two-phase coupled-inductor module 100 is relatively high.

Figure 2A:
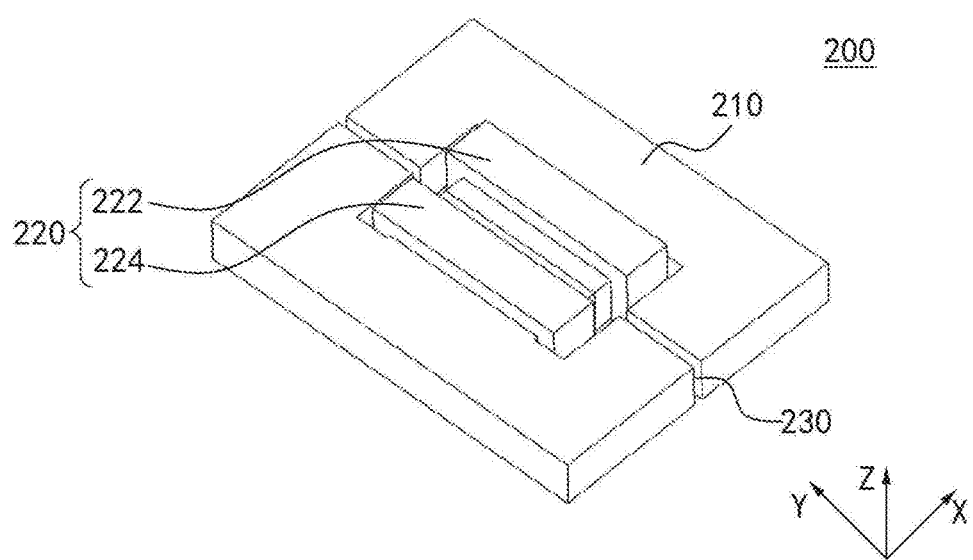
FIG. 2A to FIG. 2I are schematic diagrams of a two-phase coupled-inductor module according to the present disclosure.
Figure 2B:
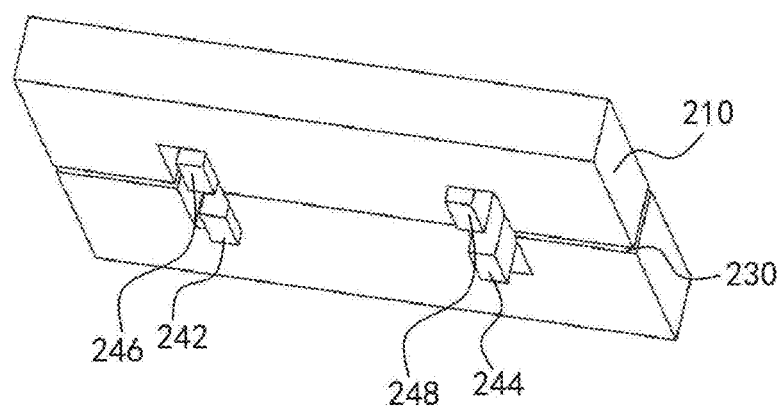

In order to further reduce the overall height of the coupled-inductor module, the present disclosure provides a novel structure of a two-phase coupled-inductor module. FIG. 2A to FIG. 2I are schematic diagrams of a two-phase coupled-inductor module according to the present disclosure. FIG. 3 schematically shows the distribution of the main magnetic flux of the two-phase coupled-inductor module according to the present disclosure. Referring to FIGS. 2A to 2I and FIG. 3, the two-phase coupled-inductor module 200 according to an embodiment of the present disclosure includes a magnetic core 210 and windings 220.

The magnetic core 210 may include a first magnetic column 212, a second magnetic column 214, and a third magnetic column 216 extending in a first direction (e.g., the x direction), and two covers 218 extending in a second direction (e.g., the y direction). The first magnetic column 212 is disposed between the second magnetic column 214 and the third magnetic column 216. The two covers 218 are respectively connected to the ends of the first magnetic column 212, the second magnetic column 214 and the third magnetic column 216.

According to the present embodiment, the first direction (e.g., the x direction) is illustrated as the direction in which the first magnetic column 212, the second magnetic column 214 and the third magnetic column 216 extend, and the second direction (e.g., the y direction) is shown as the direction in which the covers 218 extend. However, it should be understood by those skilled in the art that the first direction and the second direction (i.e., the x direction and the y direction) are merely schematic directions used for convenience of description of the present disclosure and are not intended to limit the specific direction or the order of these directions in a coordinate system (e.g., Cartesian coordinate system). For example, in other embodiments of the present disclosure, the first direction may be referred to as the width direction of the coupled-inductor module and the second direction may be referred to as the length direction of the coupled-inductor module. However, the present disclosure is not limited thereto.

The windings 220 may include a first winding 222 and a second winding 224 respectively wound around the first magnetic column 212. The first winding 222 and the second winding 224 are separated from each other in the first direction. According to the present embodiment, the first winding 222 and the second winding 224 may have the same or similar structure, but the present disclosure is not limited thereto.

Figure 3:
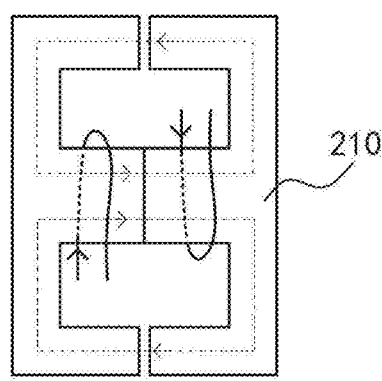
FIG. 3 schematically shows the main flux distribution of a two-phase coupled-inductor module according to the disclosure.
Figure 4:
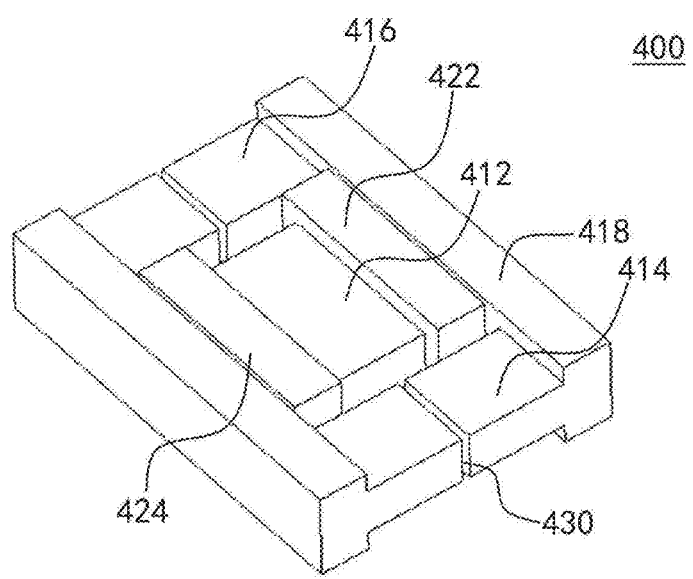
FIG. 4 is a schematic diagram of a two-phase coupled-inductor module according to another embodiment of the present disclosure.
Figure 5:
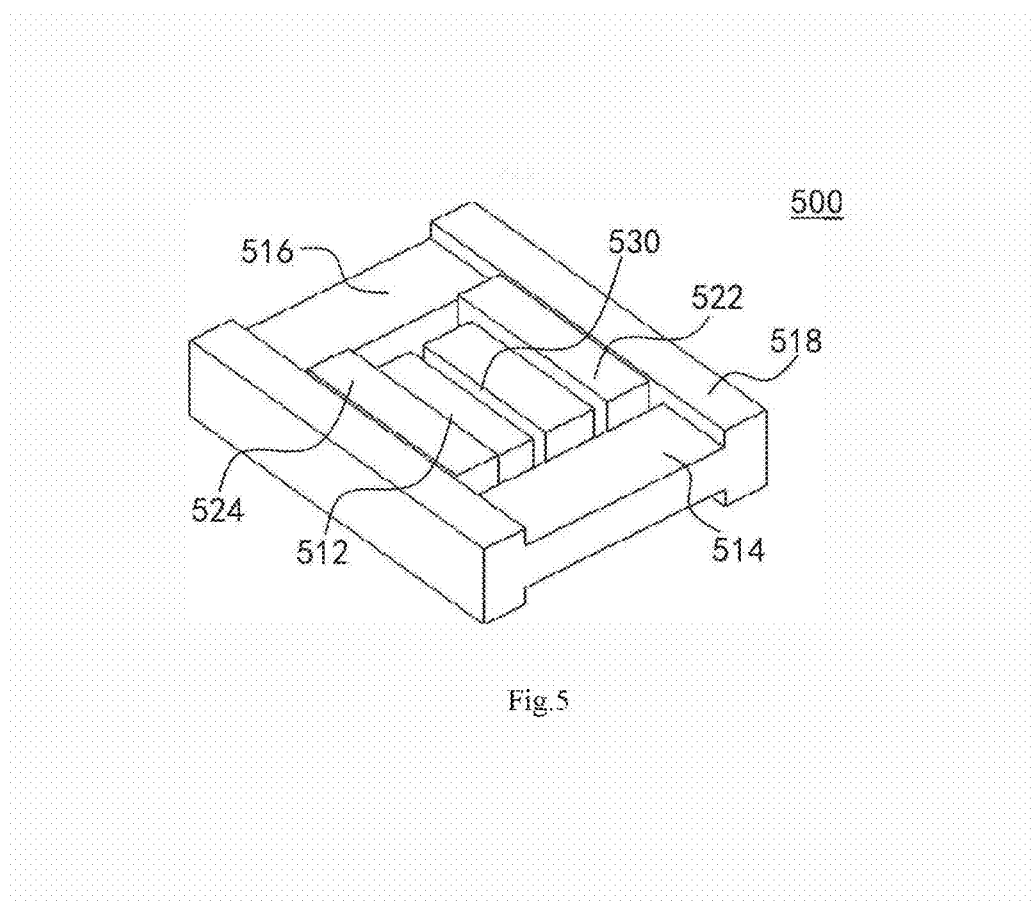
FIG. 5 is a schematic diagram of a two-phase coupled-inductor module according to yet another embodiment of the present disclosure.

At least one air gap 230 may be further provided in the magnetic core 210 to achieve a certain self-inductance and to prevent saturation. The magnetic core 210 may be formed from two E-shape cores. By designing the length of columns of the two E-shape cores, air gaps may be located only on the second magnetic column 214 and the third magnetic column 216 and no air gap is located on the first magnetic column 212 as shown in FIG. 2B and FIG. 3, or the air gap may be located only on the first magnetic column 212 and no air gap is located on the second magnetic column 214 and the third magnetic column 216 as shown in FIG. 2G, but the invention is not limited thereto, for example, the magnetic core 210 may be formed from only one core as shown in FIG. 4 and FIG. 5.

In this embodiment, the magnetic core 210 is formed from two E-shape cores, and the windings 220 and the air gap 230 are not overlapped with each other. For example, referring to FIGS. 2A and 2B, two air gap 230 are disposed on the second magnetic column 214 and the third magnetic column 216, and the windings 220 are disposed on the first magnetic column 212 which has no air gap. Therefore, according to this structure, the windings 220 and the air gap 230 are not overlapped with each other. In addition, since the windings 220 and the air gap 230 are respectively located on different magnetic columns and the windings 220 and the air gap 230 are not overlapped with each other, the windings 220 may be formed to be close to the magnetic column around which it is wound (i.e., the first magnetic column 212 in this case) without the consideration regarding the losses caused by the fringe magnetic flux at the air gap, so as to further reduce the overall height of the inductor. But the invention is not limited thereto, in another embodiment, the magnetic core 210 may be formed from two E-shape cores and three air gaps are located in the first magnetic column 212, the second magnetic column 214 and the third magnetic column 216, respectively, and still the windings 220 and the air gap 230 on the first magnetic column 212 should not be overlapped with each other.

According to the present embodiment, the first winding 222 and the second winding 224 are both disposed on the first magnetic column 212 and are spaced from each other in the first direction by a certain distance. By changing the distance between the first winding 222 and the second winding 224 in the first direction, the leakage inductance of the two-phase coupled-inductor module 200 can be adjusted.

The two ends of the first winding 222 and the second winding 224 may be provided with two surface mounting pads respectively for connecting the two-phase coupled-inductor module 200 to an external circuit (for example, to a printed circuit board (PCB)). Referring to FIG. 2B, the two surface mounting pads 242 and 244 of the first winding 222 and the two surface mounting pads 246 and 248 of the second winding 224 are formed on the same plane parallel to the plane consisting of the first direction and the second direction (e.g., the x-y plane). Compared with the inductor lead in the plug-in form, the inductor lead in a surface mounting form contributes to the overall height reduction of the inductor. The surface mounting pads in this embodiment are directly formed from surfaces of the ends of the first winding 222 and the second winding 224, and thus no further bending is needed to form the pads. But the invention is not limited thereto.

According to the present embodiment, the current flowing in the windings 220 can form magnetic flux. The mutual fluxes generated by the first winding 222 and the second winding 224 are defined as the main magnetic flux, as shown by the dotted line in FIG. 3. The magnetic flux which is generated by the first winding 222 or the second winding 224 and is only coupled with itself may be defined as leakage flux. It can be seen from the structure shown in FIGS. 2A to 2I, the plane where the main magnetic flux is located is parallel to the plane where the two surface mounting pads 242 and 244 of the first winding 222 and the two surface mounting pads 246 and 248 of the second winding 224 are located (e.g., the x-y plane). In this case, the overall height of the inductor may be equal to the height of one layer of magnetic core (H2) and the height of the two layers of conductors (H1, H3) as shown in FIG. 2E. Compared with the embodiment where the main magnetic flux plane is perpendicular to the plane of the inductor leads, the present embodiment can achieve a lower total height of the inductors.

The windings 220 may be formed by flat wires wound around the first magnetic column 212. Referring to FIG. 2D, the flat wire is illustrated as a wire having a rectangular cross-sectional shape. In the present embodiment, the direction in which the long side of the rectangle (i.e., the shape of the rectangular cross-section) is located is referred to as the width of the flat wire, and the direction in which the short side of the rectangle is located is referred to as the thickness of the flat wire. The flat wire is wound around the first magnetic column 212. In one embodiment, a width direction of the flat wire is parallel to the first direction (for example, the x-direction), which may facilitate the reduction of the overall height of the inductor.

According to the present embodiment, it is optional that the projection of the two-phase coupled-inductor module 200 on the plane (e.g., the x-y plane) on which the surface mounting pads 242 to 248 are located is a centrosymmetric pattern, and the distributions of the windings 220 and the air gap 230 are both centrosymmetric, which may facilitate the symmetry of the inductance of the two-phase inductor.

Figure 2C:
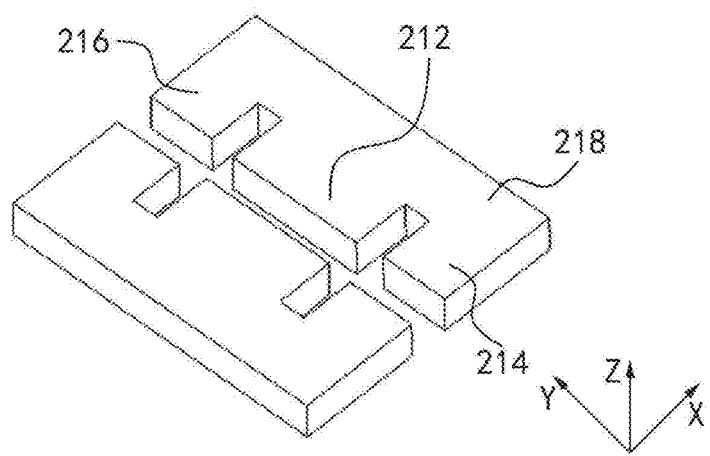
Figure 2D:
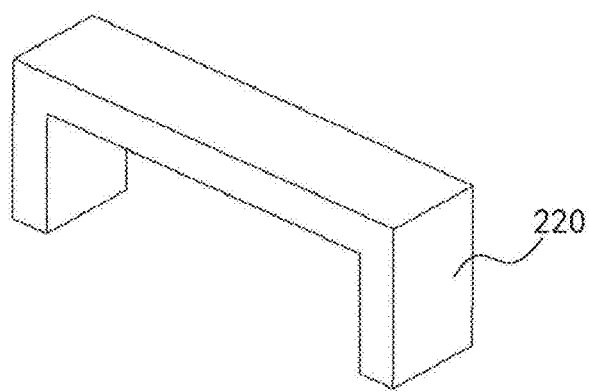
Figure 2E:
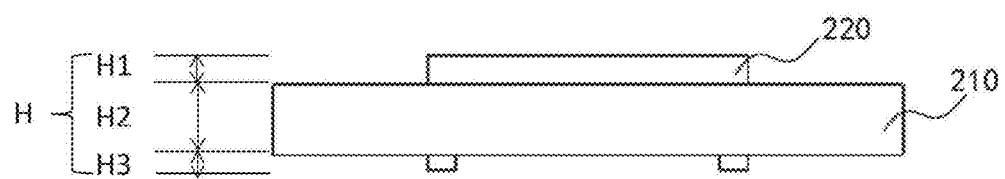

In addition, in the manufacturing process, the core 210 may be formed by combining multiple sub-cores, such as two sub-cores having "E" shape, as shown in FIG. 2C. In addition, as shown in FIG. 2D, the windings 220 may be preformed, and then the preformed windings 220 may be assembled with the magnetic core 210. Therefore, during manufacturing process of the two-phase coupled-inductor module 200, it is unnecessary to bend the windings 220 wound around the magnetic core 210, thus avoiding the risk of damaging the magnetic core 210.

Figure 2F:
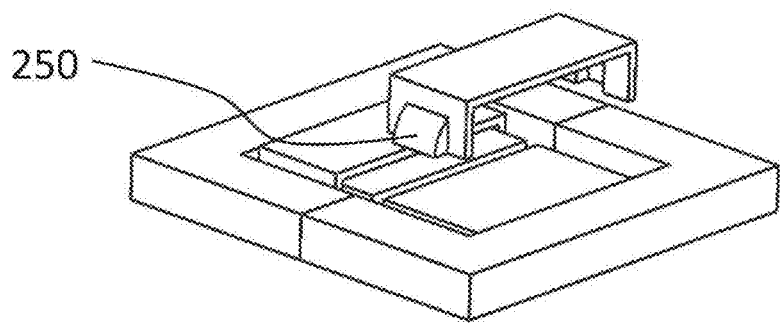
Figure 2G:
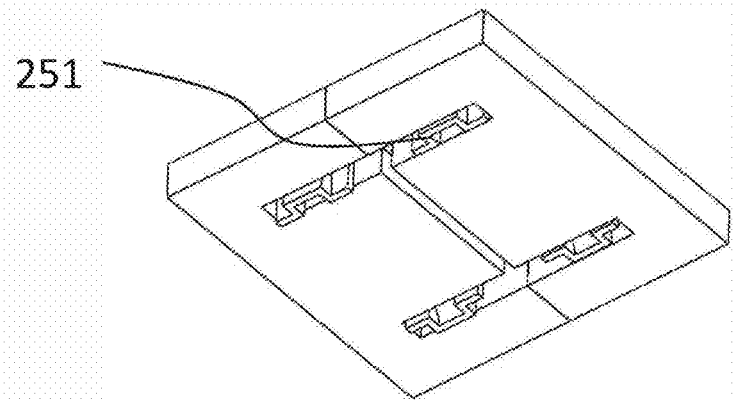
Figure 2H:
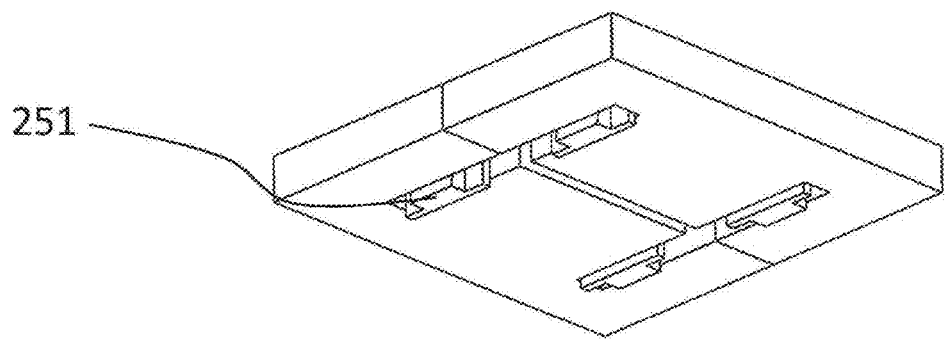
Figure 2I:
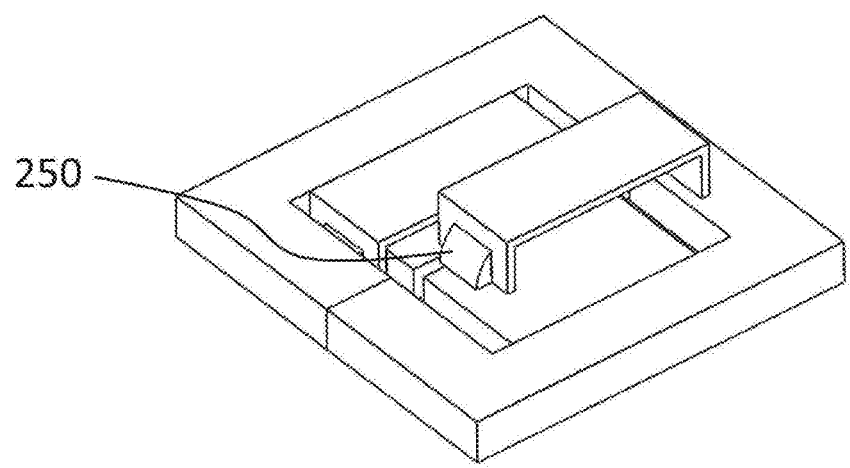

Referring to FIGS. 2F-2I, there is shown a specific example of the lead 250 of the windings 220. In FIGS. 2F-2I, a protrusion is located on the lead 250 to form an external pad 251 for electrically connecting the windings 220 to an external circuit. Referring to FIGS. 2F and 2G, the external pad 251 is formed in a hollow zigzag shape as the protrusion is in a hollow shape. For example, the protrusion may be formed into a hollow shape by bending or punching the lead 250. In another embodiment, referring to FIGS. 2H and 2I, a lead of the winding forms an external pad 251 with a protrusion, and the external pad 251 is in a zigzag shape. For example, the protrusion may be formed into a solid shape by forming additional metal bumps on the leads 250. In the present embodiment, the external pad 251 is formed to be bent toward the outside of the windings 220. In other words, the external pad 251 is formed to be bent in a direction away from the first magnetic column. According to this embodiment, the zigzag shaped external pad 251 can effectively increase the soldering contact area between the lead 250 and the external circuit, thereby facilitating the improvement of the conductivity and the mechanical strength of the junction.

According to an embodiment of the present disclosure, the height of the two-phase coupled-inductor module 200 may be formed to be less than 6 mm.

FIG. 4 is a schematic diagram of a two-phase coupled-inductor module according to another embodiment of the present disclosure. Referring to FIG. 4, in the two-phase coupled-inductor module 400, in a direction (i.e., the z-direction) perpendicular to the plane (i.e., the x-y plane) where the first direction and the second direction are located, the height of the cover 418 is greater than the height of the first magnetic column 412, the second magnetic column 414, and the third magnetic column 416. After the windings are located on the column, the thickness of the windings may not affect the height of the overall height of the inductors. In this way, it may facilitate further improvement of the space utilization, and the assembled windings may still have a smaller height. But the invention is not limited thereto. Further, the first winding 422 and the second winding 424 are located on the first magnetic column 412. Air gaps are located only on the second magnetic column 414 and the third magnetic column 416. Other aspects of this embodiment may be the same as or similar to those of the foregoing embodiments, and thus their detailed descriptions are omitted.

FIG. 5 is a schematic diagram of a two-phase coupled-inductor module according to another embodiment of the present disclosure. Referring to FIG. 5, the difference between the two-phase coupled-inductor module 500 of the present embodiment and the two-phase coupled-inductor module of the previous embodiment mainly lies in that an air gap 530 is formed in a center column (for example, the first magnetic column 512). Other aspects of this embodiment may be the same as or similar to those of the foregoing embodiments, and thus their detailed descriptions are omitted.

As shown in FIG. 5, the air gap 530 is located in the middle of the first magnetic column 512, the first winding 522 and the second winding 524 are located at both ends of the first magnetic column 512, and the first winding 522 and the second winding 524 are arranged to be separated from the air gap 530 in a first direction (for example, the said x direction). That is, the first winding 522 and the second winding 524 do not cover the air gap 530. In other words, the first winding 522 and the second winding 524 are respectively formed on both sides of the air gap 530 and do not overlap with the air gap 530. One main advantage of the air gap located in the center column, compared with the embodiment in which the air gap is located at the side column (e.g., the second magnetic column 514 and the third magnetic column 516), is that the leakage magnetic flux is smaller, thereby reducing the electromagnetic interference.

Figure 6:
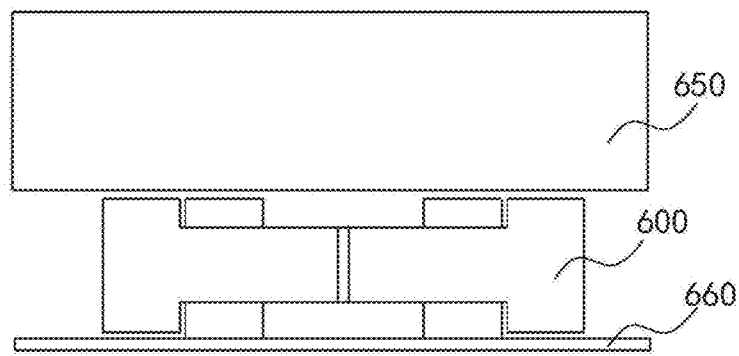
FIG. 6 schematically shows a schematic view of a two-phase coupled-inductor module with a heat sink arranged above according to an embodiment of the present disclosure.

FIG. 6 schematically shows arranging a heat sink over a two-phase coupled-inductor module according to an embodiment of the present disclosure. In FIG. 6, a two-phase coupled-inductor module 600 is soldered on a substrate 660 (e.g., a printed circuit board (PCB)) and a heat sink 650 is disposed over the two-phase coupled-inductor module 600. The heat sink 650 is usually formed of a conductor such as aluminum, copper or the like. In this case, the leakage magnetic flux generated by the two-phase coupled-inductor module 600 may cause eddy current loss in the conductor forming the heat sink 650. When the air gap is designed to be located in the first magnetic column, the leakage flux can be further reduced, thereby reducing the eddy current loss due to the leakage magnetic flux.

Figure 7:
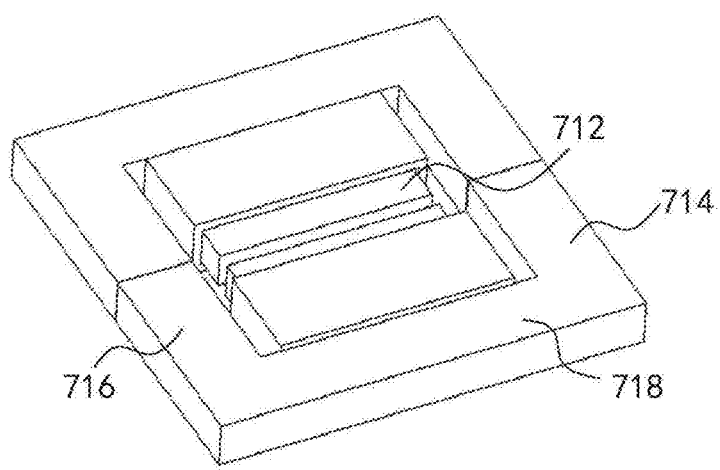
FIG. 7 is a schematic view of a two-phase coupled-inductor module according to another embodiment of the present disclosure.
Figure 8:
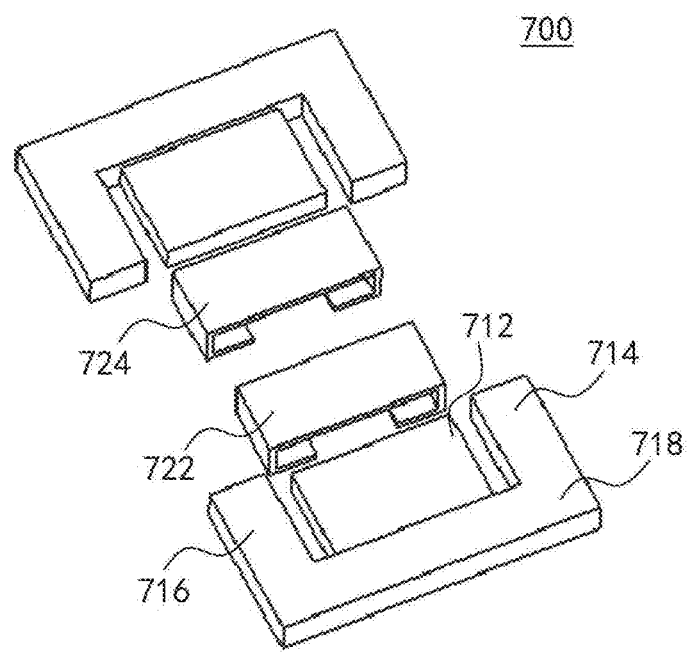
FIG. 8 is an exploded view of the two-phase coupled-inductor module shown in FIG. 7.

FIG. 7 is a schematic diagram of a two-phase coupled-inductor module according to another embodiment of the present disclosure. FIG. 8 is an exploded view of the two-phase coupled-inductor module shown in FIG. 7. With reference to FIG. 7 and FIG. 8, the difference between the two-phase coupled-inductor module 700 of the present embodiment and the two-phase coupled-inductor module of the foregoing embodiment mainly lies in that in the two-phase coupled-inductor module 700, in a direction (e.g., the z-direction) perpendicular to a plane (e.g., the x-y plane) in which the first direction and the second direction are located, the height of the first magnetic column 712 is smaller than the height of the second magnetic column 714, the third magnetic column 716 or the cover 718, which may further improve the space utilization, and reduce the height or area, considering the thickness of the windings. Other aspects of this embodiment are the same as or similar to those of the foregoing embodiments, and thus their detailed descriptions are omitted. In addition, as shown in FIGS. 7 and 8, the height of the first magnetic column 712 is smaller than the height of the second magnetic column 714, the third magnetic column 716 and the cover 718, and the second magnetic column 714 and the third magnetic column 716 and the cover 718 have the same height. After the windings are located on the first magnetic column 712, the height of the windings and the first magnetic column 712 may be the same of the height of the other columns and the covers. However, the present disclosure is not limited thereto. The height of the second magnetic column 714 and the third magnetic column 716 may also be different from the height of the cover 718. For example, the height of the second magnetic column 714 and/or the third magnetic column 716 may be less than the height of the cover 718.

In addition, referring to FIGS. 7 and 8, the ends of the first winding 722 and the second winding 724 may be bent inward so that two surface mounting pads are formed on each of the windings respectively. More specifically, the ends of the first winding 722 and the second winding 724 may be bent so that the surface mounting pads are respectively formed on the bottom surface of the first magnetic column 712. According to an embodiment of the present disclosure, the bottom surface of the two-phase coupled-inductor module 700 faces a PCB when it is mounted thereto.

According to the present embodiment, the bottom surfaces of the first magnetic column 712, the second magnetic column 714, the third magnetic column 716, and the cover 718 may be in the same plane.

According to the present embodiment, the upper surfaces of the first winding 722, the second winding 724, the second magnetic column 714, the third magnetic column 716 and the cover 718 may be in the same plane.

Figure 9:
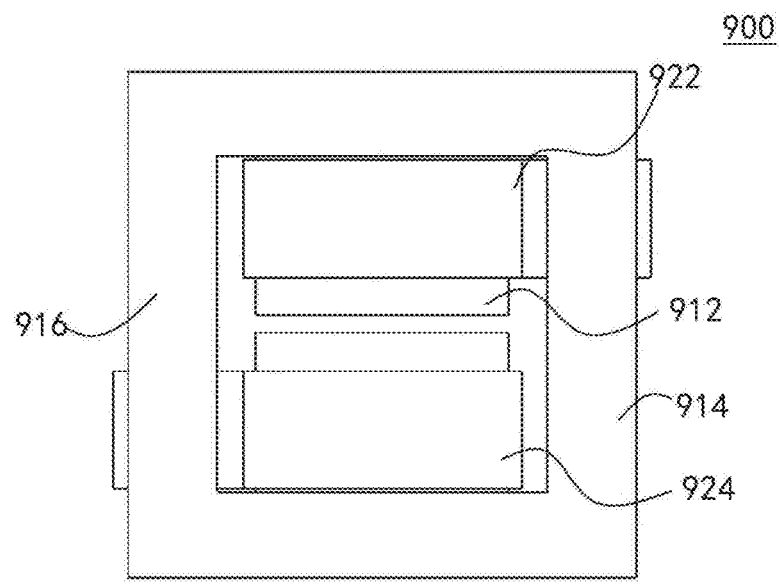
FIG. 9 is a schematic view of a two-phase coupled-inductor module according to still another embodiment of the present disclosure.

FIG. 9 is a schematic diagram of a two-phase coupled-inductor module according to another embodiment of the present disclosure. As shown in FIG. 9 which illustrates a different embodiment from the embodiments shown in FIGS. 7 and 8, the first winding 922 and the second winding 924 of the two-phase coupled-inductor module 900 respectively have ends which are bent away from the center of the first magnetic column 912 so that the surface mounting pads may be formed respectively. Specifically, the first winding 922 has an end bent toward the second magnetic column 914, the second winding 924 has an end bent toward the third magnetic column 916.

Figure 10:
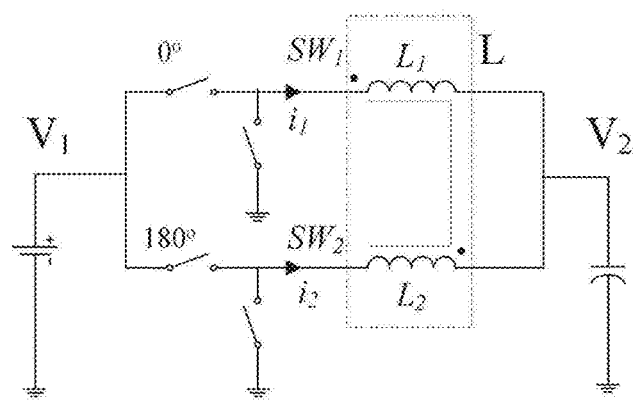
FIG. 10 is a circuit diagram of a two-phase VRM in accordance with one embodiment of the present disclosure.
Figure 11:
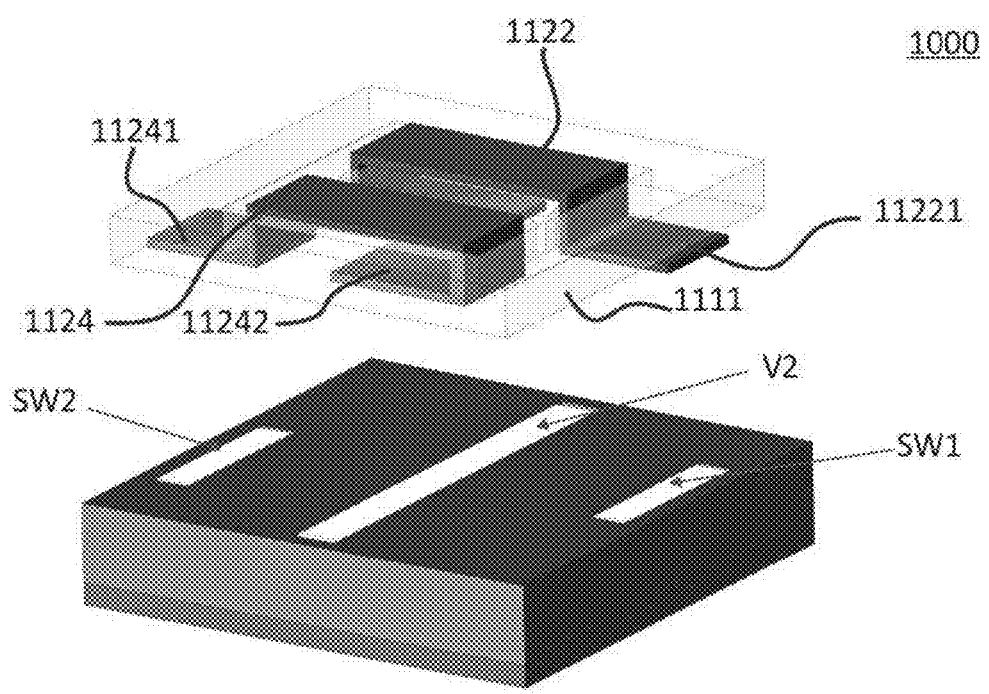
FIG. 11 is a structural layout of a two-phase VRM according to one embodiment of the present disclosure.
Figure 12:
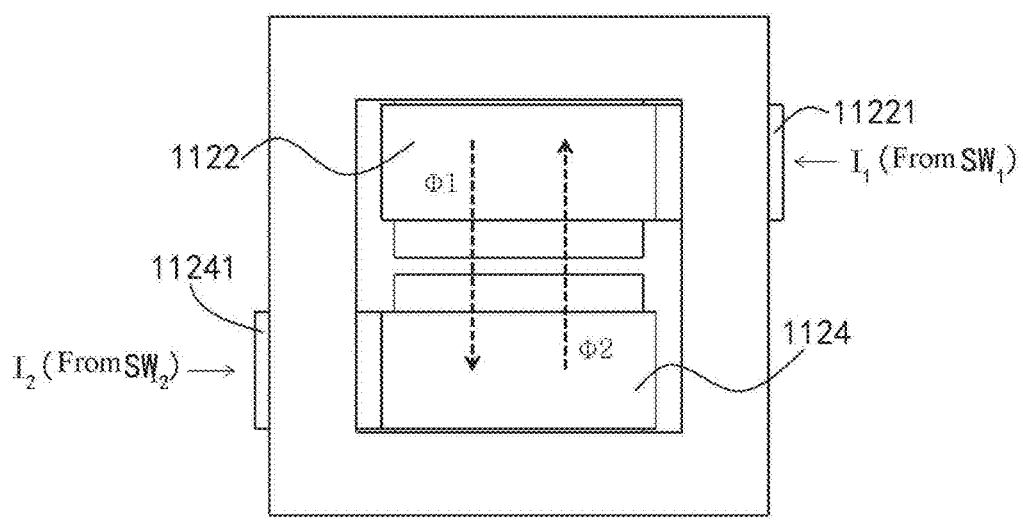
FIG. 12 schematically shows the magnetic flux generated in the two-phase coupled-inductor module when the VRM in FIG. 11 is energized.

FIG. 10 is a circuit diagram of a two-phase voltage regulation module (VRM) according to an embodiment of the present disclosure. FIG. 11 is a structural layout diagram of a two-phase VRM according to an embodiment of the present disclosure, and FIG. 12 schematically shows the magnetic flux generated in the two-phase coupled-inductor module when the VRM in FIG. 11 is energized.

Referring to FIG. 10, the two-phase VRM converts the input voltage V1 to the output voltage V2 so as to power the load. In order to achieve a larger output current, the VRM is implemented by connecting two phases in parallel. The VRM contains two switch units and a two-phase coupled-inductor module. The coupled-inductor module includes four terminals. The first terminal of the inductors is connected to a terminal SW1 of a first switch unit. The third terminal of the inductor is connected to a terminal SW2 of a second switch unit. The second terminal and the fourth terminal of the inductor are directly connected together to serve as the common output terminal V2 of the entire voltage regulating module. In order to achieve lower output ripple, the different phases may be operated with a phase difference, which is commonly referred to as an interleaving operation. As shown in the drawings, the two phases may differ from each other by 180 degrees.

The two-phase VRM according to the disclosure will be described further below with reference to FIG. 11. As shown in FIG. 11, the two-phase VRM 1000 includes two-phase coupled-inductor module 1111 including a first winding 1122 and a second winding 1124. The first winding 1122 has a first terminal 11221 and a second terminal, and the second winding 1124 has a third terminal 11241 and a fourth terminal 11242.

The two-phase VRM 1000 further includes: a terminal SW1 of the first switch unit connected to the first terminal 11221 of the first winding 1122; a terminal SW2 of the second switch unit connected to the third terminal 11241 of the second winding 1124; and an output terminal V2 electrically connected the second terminal of the first winding 1122 and the fourth terminal 11242 of the second winding 1124.

According to the present embodiment, the two-phase coupled-inductor module 1111 may have a similar structure to the two-phase coupled-inductor module 900 illustrated in FIG. 9. Specifically, the first terminal 11221 may be formed under the second magnetic column, the third terminal 11241 is formed under the third magnetic column, and the second terminal and the fourth terminal 11242 are formed under the first magnetic column. This terminal arrangement may match the terminal position of the switch unit in the inverse-coupling application better, such as the terminal SW1 of the first switch unit, the terminal SW2 of the second switch unit and the output terminal V2 as shown in FIG. 11.

In addition, the second terminal and the fourth terminal 11242 of the two-phase coupled-inductor module 1111 which are connected to each other may be connected to the output terminal V2 of the two-phase VRM 1000.

In addition, referring to FIG. 12, when a first current I1 and a second current I2 are respectively supplied to the first winding 1122 and the second winding 1124 through the first terminal 11221 and the third terminal 11241, the first current I1 and the second current I2 generate a first magnetic flux Φ1 and a second magnetic flux Φ2 in the first magnetic column. As shown in FIG. 12, the first magnetic flux Φ1 and the second magnetic flux Φ2 have directions opposite to each other in the first magnetic column which has an air gap.

According to the above configuration, the first terminal 11221 of the two-phase coupled-inductor module 1111 is connected to the terminal SW1 of the first switch unit, the third terminal 11241 of the two-phase coupled-inductor module 1111 is connected to the terminal SW2 of the switch unit, and the two terminals and the fourth terminal 11242 are both connected to the output terminal of the two-phase VRM 1000 to realize a direct electrical connection. Therefore, by using the arrangement of the leads of the inductor in the present embodiment, the interconnection with the switch units can be conveniently realized, and the connection loss may be reduced.

Figure 11A:
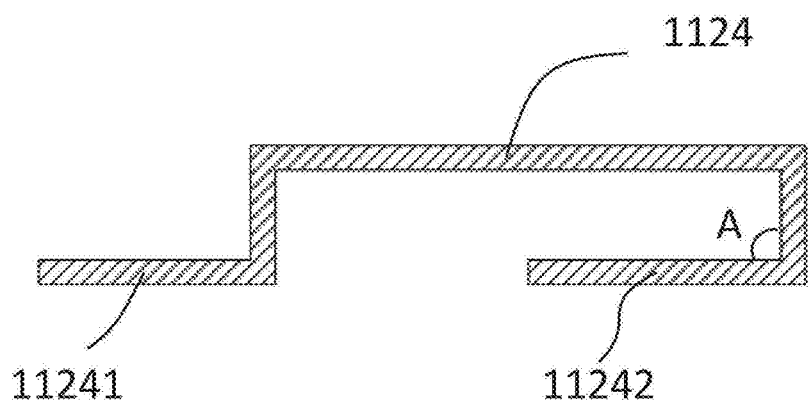
FIG. 11A is a schematic structural view of a winding according to an embodiment of the present disclosure.
Figure 11B:
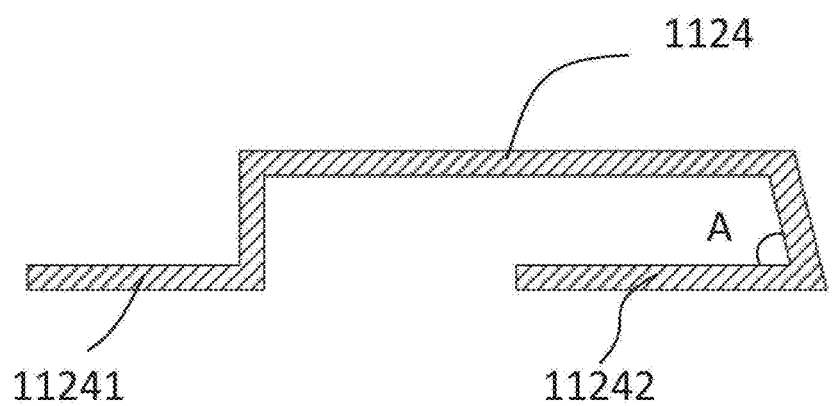
FIG. 11B is a schematic structural view of a winding according to another embodiment of the present disclosure.

In the manufacturing process of the coupled-inductor module according to various embodiments of the present disclosure, the windings may be preformed and then assembled with the magnetic core. For example, FIG. 11A is a schematic structural view of a winding according to an embodiment of the present disclosure, and FIG. 11B is a schematic structural view of a winding according to another embodiment of the present disclosure. FIGS. 11A and 11B schematically show the winding 1124 in the coupled-inductor module 1111. However, the disclosure is not limited thereto and the structure of the winding 1124 may also be applied to the winding according to other embodiments of the present disclosure.

A side view of the preformed winding 1124 is shown in FIG. 11A. The winding 1124 is preformed to form a U-shaped winding body and leads 11241 and 11242 formed at two ends of the U-shaped winding body. In another embodiment, the magnetic core has a very small thickness so that it is often difficult to form a bevel on the first magnetic column. In the assembly of the winding, the bending angle A between the fourth terminal 11242 and the winding body may interfere with the first magnetic column. Therefore, as shown in FIG. 11B, optionally, the bending angle of the fourth terminal 11242 under the first magnetic column with respect to the winding body is smaller than 90 degrees. Optionally, the above-mentioned bending angle A is formed to be 75 degrees. Similarly, the second terminal located under the first magnetic column may also be formed with a similar bending angle. In an embodiment, the bending angles of the second terminal and the fourth terminal relative to the winding body may all be acute angles and may have the same degree.

Figure 13A:
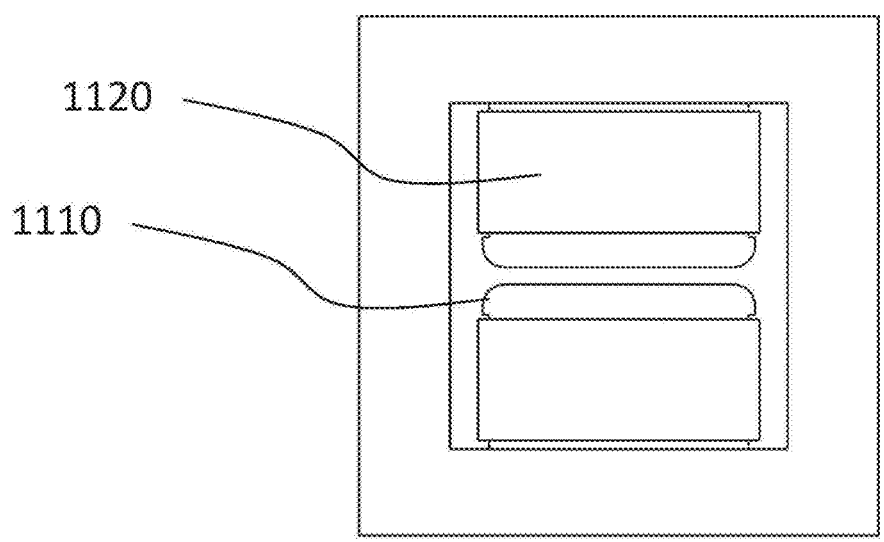
FIGS. 13A and 13B are schematic diagrams of a two-phase coupled-inductor module according to one embodiment of the present disclosure.
Figure 13B:
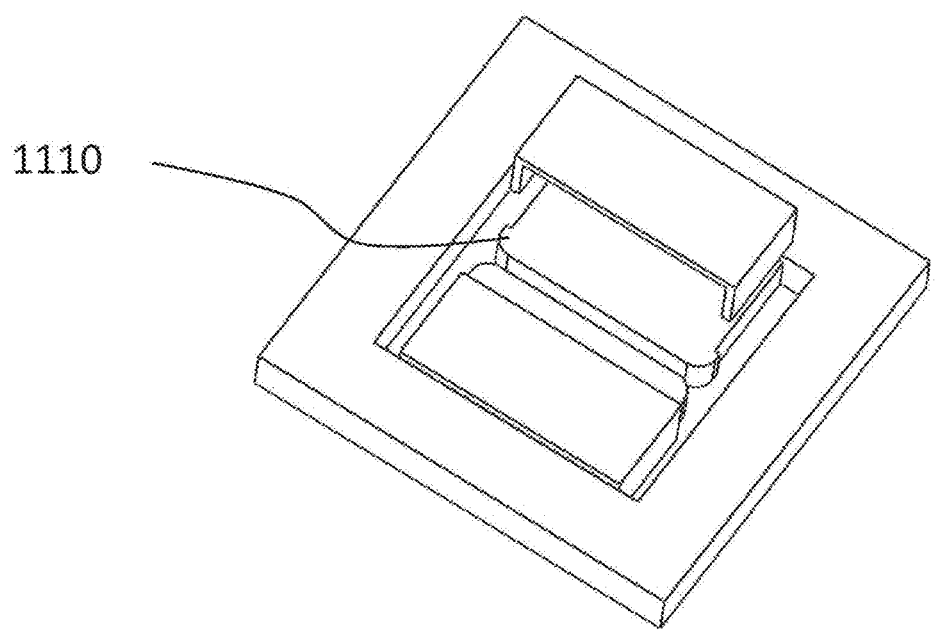

FIGS. 13A and 13B are schematic diagrams of a two-phase coupled-inductor module according to an embodiment of the present disclosure. Referring to FIGS. 13A and 13B, at least a stopper 1110 is formed on the first magnetic column of the two-phase coupled-inductor module according to the present embodiment. The stopper 1110 is configured to prevent the winding 1120 from moving. For the details of other structures of the two-phase coupled-inductor module according to the present embodiment, reference may be made to the foregoing embodiments and details are not described herein again.

More specifically, referring to FIGS. 13A and 13B, the stopper 1110 is formed at an end of the first magnetic column close to the air-gap such that the cross-sectional area of the stopper 1110 and the first magnetic column in the second direction (i.e., the sum of the two areas) is larger than the cross-sectional area of only the first magnetic column in the second direction. In this case, the stopper 1110 prevents the winding 1120 from moving and overlapping the air gap. The stopper 1110 may be integrally formed with a corresponding first magnetic column or may be additionally formed onto the first magnetic column. The stopper 1110 may be formed of the same material as the magnetic column, or may be formed of a different material. In this embodiment, due to the arrangement of the stopper 1110, the assembly position of the winding 1120 can be easily determined during assembly process, thereby improving the assembly efficiency of the inductor. In the case where the stopper 1110 is formed of a magnetic material, it is also possible to adjust the leakage inductance using the stopper 1110. In addition, the stopper 1110 may be formed with a curved surface, in which case it is also possible to reduce or prevent abrasion between the winding 1120 and the stopper 1110 during assembly process. However, the present disclosure is not limited thereto, and the stopper 1110 may have a different shape from the shapes illustrated in FIGS. 13A and 13B. The stopper may also be located on the second magnetic column or the third column if the windings are located on them, and the present disclosure is not limited to this.

The two-phase coupled-inductor module provided according to the embodiments of the present disclosure may have at least the following advantages. Firstly, the height is very small, and thus the inductor is suitable for the applications having high requirements on the height. Secondly, the leakage magnetic flux is small, and thus the inductor is suitable for use in the place where is sensitive and vulnerable to be interfered. Thirdly, the manufacturing process is simple since the winding can be preformed without having to be bend together with the core. But the invention is not limited thereto.

Other embodiments of the present disclosure will readily occur to those skilled in the art upon consideration of the specification and practice of the disclosures disclosed herein. This application is intended to cover any variations, uses, or adaptations of the disclosure that follow the general principles of the disclosure and include the common sense or the customary technical means in the art, which is not disclosed in this disclosure. It is intended that the specification and examples be considered as exemplary only, with the true scope and spirit of the disclosure being indicated by the following claims.

It should be understood that the present disclosure is not limited to the precise structures that have been described above and shown in the drawings, and various modifications and changes may be made without departing from the scope thereof. The scope of the disclosure is limited only by the accompanying claims.

What is claimed is:

1. A coupled-inductor module comprising:
a magnetic core, comprising a first magnetic column, a second magnetic column, and a third magnetic column extending in a first direction and two covers extending in a second direction, wherein the first magnetic column is disposed between the second magnetic column and the third magnetic column, the two covers are respectively connected to two ends of the first magnetic column, two ends of the second magnetic column and two ends of the third magnetic column; and
windings, including a first winding and a second winding respectively wound around the first magnetic column, the first winding and the second winding being spaced apart from each other in the first direction,
wherein the magnetic core is provided with at least one air gap, and the windings and the air gap are not overlapped with each other, and
wherein the magnetic core is formed from two E-shaped cores, wherein the air gap is disposed only on the first magnetic column, or two air gaps are respectively disposed on the second magnetic column and the third magnetic column, or three air gaps are respectively disposed on the first magnetic column, the second magnetic column and the third magnetic column.

2. The coupled-inductor module according to claim 1, wherein the at least one air gap comprises two air gaps respectively disposed on the second magnetic column and the third magnetic column.

3. The coupled-inductor module according to claim 1, wherein the at least one air gap comprises one air gap disposed on the first magnetic column, and the first winding and the second winding are respectively located on two sides of the air gap.

4. The coupled-inductor module according to claim 1, wherein two ends of the first winding and two ends of the second winding respectively form surface mounting pads, and each of the surface mounting pads is located in a same plane that is parallel to a plane formed by the first direction and the second direction.

5. The coupled-inductor module according to claim 1, wherein each of the windings is formed of a flat wire which is wound around the first magnetic column, and a width direction of the flat wire is parallel to the first direction.

6. The coupled-inductor module according to claim 1, wherein the projection of the coupled-inductor module in a plane formed by the first direction and the second direction has a centrosymmetric shape, and the windings and the air gap are both distributed in a centro symmetric manner.

7. The coupled-inductor module according to claim 1, wherein a height of the coupled-inductor module in a third direction perpendicular to the first direction and the second direction is less than 6 mm.

8. A coupled-inductor module comprising:
a magnetic core, comprising a first magnetic column, a second magnetic column, and a third magnetic column extending in a first direction and two covers extending in a second direction, wherein the first magnetic column is disposed between the second magnetic column and the third magnetic column, and the two covers are respectively connected to two ends of the first magnetic column, two ends of the second magnetic column and two ends of the third magnetic column; and
windings, including a first winding and a second winding respectively wound around the first magnetic column, the first winding and the second winding being spaced apart from each other in the first direction,
wherein the magnetic core is provided with at least one air gap, and the windings and the air gap are not overlapped with each other, and
wherein in a third direction perpendicular to the first direction and the second direction, a height of the first magnetic column is smaller than a height of the second magnetic column, the third magnetic column or the cover.

9. The coupled-inductor module according to claim 8, wherein bottom surfaces of the first magnetic column, the second magnetic column, the third magnetic column and the cover are disposed in a same plane.

10. The coupled-inductor module according to claim 9, wherein the first winding and the second winding are formed of flat wires, the upper surfaces of the first winding, the second winding, the second magnetic column, the third magnetic column and the cover are disposed in a same plane.

11. The coupled-inductor module according to claim 1, wherein a lead of the windings forms an external pad with a protrusion, and the external pad is in a zigzag shape.

12. The coupled-inductor module according to claim 1, wherein the first magnetic column forms a stopper to prevent the winding from moving.

13. A voltage regulating module, comprising:
a coupled-inductor module, comprising: a magnetic core, comprising a first magnetic column, a second magnetic column, and a third magnetic column extending in a first direction and two covers extending in a second direction, wherein the first magnetic column is disposed between the second magnetic column and the third magnetic column, the two covers are respectively connected to two ends of the first magnetic column, two ends of the second magnetic column and two ends of the third magnetic column; and windings, including a first winding and a second winding respectively wound around the first magnetic column, the first winding and the second winding being spaced apart from each other in the first direction, wherein the magnetic core is provided with at least one air gap, and the windings and the air gap are not overlapped with each other, and wherein the first winding having a first terminal and a second terminal, the second winding having a third terminal and a fourth terminal, the second terminal of the first winding and the fourth terminal of the second winding are electrically connected to each other;
a first switch unit connected to the first terminal of the first winding; and a second switch unit connected to the third terminal of the second winding, and wherein a bending angle of the second terminal with respect to an U-shaped body of the first winding and/or a bending angle of the fourth terminal with respect of an U-shaped body of the second winding are less than 90 degrees.

14. The voltage regulating module according to claim 13, wherein, the first terminal is formed under the second magnetic column, the third terminal is formed under the third magnetic column, and the second terminal and the fourth terminal are formed under the first magnetic column.

15. The voltage regulating module according to claim 13, wherein in the case where a first current flows into the first winding from the first terminal and a second current flows into the second winding from the third terminal, magnetic fluxes respectively generated in the first magnetic column by the first current in the first winding and by the second current in the second winding have opposite directions.

16. The voltage regulating module according to claim 13, wherein the first switch unit and the second switch unit are located under a bottom surface of the coupled-inductor module.

* * * * *